(12) United States Patent
Tamura et al.

(10) Patent No.: US 7,459,738 B2
(45) Date of Patent: Dec. 2, 2008

(54) FERROELECTRIC MEMORY ELEMENT AND METHOD FOR MANUFACTURING THE SAME

(75) Inventors: Hiroaki Tamura, Kuwara (JP); Koichi Kobayashi, Suwa (JP)

(73) Assignee: Seiko Epson Corporation (JP)

( * ) Notice: Subject to any disclaimer, the term of this patent is extended or adjusted under 35 U.S.C. 154(b) by 504 days.

(21) Appl. No.: 11/088,258

(22) Filed: Mar. 23, 2005

(65) Prior Publication Data
US 2005/0221565 A1 Oct. 6, 2005

(30) Foreign Application Priority Data
Mar. 24, 2004 (JP) ............... 2004-087603

(51) Int. Cl.
*H01L 27/108* (2006.01)
(52) U.S. Cl. ..................... 257/295; 257/751
(58) Field of Classification Search ......... 257/295, 257/751
See application file for complete search history.

(56) References Cited

U.S. PATENT DOCUMENTS

| 6,066,868 A * | 5/2000 | Evans, Jr. .......... 257/295 |
| 6,314,283 B1 | 11/2001 | Fielden |
| 6,635,561 B2 | 10/2003 | Kawai |
| 6,781,184 B2 * | 8/2004 | Solayappan et al. ......... 257/310 |

FOREIGN PATENT DOCUMENTS

| JP | 11-126881 | 5/1999 |
| JP | 2002-094000 | 3/2002 |
| JP | 2002-222933 | 8/2002 |
| JP | 2003-115545 | 4/2003 |
| JP | 2003-243625 | 8/2003 |
| JP | 2003-282825 | 10/2003 |
| JP | 2004-31553 | 1/2004 |

* cited by examiner

*Primary Examiner*—Douglas M Menz
(74) *Attorney, Agent, or Firm*—Harness, Dickey & Pierce, P.L.C.

(57) ABSTRACT

A ferroelectric memory element has a memory cell array including memory cells arranged in a matrix configuration, each of the memory cells having a lower electrode, an upper electrode arranged in a direction intersecting the lower electrode, and a ferroelectric layer disposed at least in an intersecting area between the upper electrode and the lower electrode, wherein a hydrogen barrier film and a hydrogen barrier film are arranged at least below the memory cell array, and a bottom hydrogen barrier film is arranged below the memory cell array.

10 Claims, 20 Drawing Sheets

FERROELECTRIC MEMORY ELEMENT AND METHOD FOR MANUFACTURING THE SAME

RELATED APPLICATIONS

This application claims priority to Japanese Patent Application No. 2004-087603 filed Mar. 24, 2004 which is hereby expressly incorporated by reference herein in its entirety.

BACKGROUND

1. Technical Field

The present invention relates to a ferroelectric memory element including a memory cell array and a method for manufacturing the same.

2. Related Art

In a process for manufacturing a ferroelectric memory element, after a ferroelectric capacitor is formed, a ferroelectric layer may be exposed to a hydrogen atmosphere at the time of forming an interlayer insulation layer and conducting dry etching. A ferroelectric layer is generally composed of a metal oxide. For this reason, when the ferroelectric layer is exposed to hydrogen, oxygen contained in the ferroelectric layer is reduced by the hydrogen. As a result, the ferroelectric layer is damaged. For example, when a ferroelectric layer consists of SBT ($SrBi_2Ta_2O_9$), and the SBT is reduced by hydrogen, the metal Bi is generated at grain boundaries, and the upper electrode and the lower electrode would become short-circuited. To prevent the deterioration by reduction of the ferroelectric layer, a so-called hydrogen barrier film that is a protection film is formed around the ferroelectric capacitor.

However, with the conventional memory element structure, it is extremely difficult to completely cover the ferroelectric layer with a hydrogen barrier film. For example, Japanese laid-open patent application 2000-68987 describes a hydrogen barrier film formed on a ferroelectric capacitor. However, contact holes are formed in the hydrogen barrier film over the upper electrodes for connecting the upper electrodes to a peripheral circuit section. Also, contact holes are formed in the hydrogen barrier film below the lower electrodes for connecting the lower electrodes to the peripheral circuit section. There is therefore a problem in that hydrogen can readily enter the contact hole sections where the hydrogen barrier film is not formed, and the ferroelectric layer is reduced.

It is an object of the present invention to provide a ferroelectric memory element in which its ferroelectric layer is not damaged by a reducing atmosphere generated during the process of forming the ferroelectric memory element, and a method for manufacturing the same.

SUMMARY

Ferroelectric Memory Element

A ferroelectric memory element in accordance with the present invention has a memory cell array having memory cells arranged in a matrix configuration, each of the memory cells having a lower electrode, an upper electrode arranged in a direction intersecting the lower electrode, and a ferroelectric layer disposed at least in an intersection area between the upper electrode and the lower electrode, and the ferroelectric memory element is characterized in that hydrogen barrier films are formed above and below the memory cell array.

The structure described above provides an effect in that the ferroelectric layer can be prevented from being deteriorated by reduction, because the memory cell array region is completely protected from hydrogen that may enter from its upper section and lower section.

The ferroelectric memory element in accordance with the present invention is characterized in comprising a peripheral circuit section for selectively writing or reading information in and from the memory cells, wherein the hydrogen barrier films are not formed over the peripheral circuit section.

The structure described above provides an effect in that the ferroelectric layer can be protected from being deteriorated by reduction, and the device characteristics of the peripheral circuit section can be recovered, because hydrogen can be supplied only to the peripheral circuit section when a heat treatment is conducted in a hydrogen atmosphere.

The ferroelectric memory element in accordance with the present invention is characterized in comprising an interlayer insulation layer provided over the memory cell array, wherein a hydrogen barrier film is provided between the interlayer insulation layer and the memory cell array.

The structure described above provides an effect in that the ferroelectric layer can be protected from hydrogen that is generated as a reaction by-product at the time of forming the interlayer insulation layer.

The ferroelectric memory element in accordance with the present invention is characterized in comprising a hydrogen barrier film provided over the interlayer insulation layer.

The structure described above provides an effect in that the ferroelectric layer can be protected from process originated hydrogen generated after the process of wiring between the memory cell array and the peripheral circuit section.

The ferroelectric memory element in accordance with the present invention is characterized in that the upper electrode or the lower electrode contains a material having a hydrogen barrier function.

The structure described above provides an effect in that a stronger barrier function can be formed against hydrogen entering from the upper side and/or lower side of the ferroelectric layer.

The ferroelectric memory element in accordance with the present invention is characterized in that the ferroelectric layer is provided only in the intersecting region between the lower electrode and the upper electrode.

The structure described above provides an effect in that the squareness of the hysteresis loop is improved because protrusion of lines of electric force from the memory cell can be suppressed to a minimum when an electric field is impressed across the upper electrode and the lower electrode.

The ferroelectric memory element in accordance with the present invention is characterized in that the hydrogen barrier film is formed at side walls of the lower electrode, the upper electrode, and the ferroelectric layer.

The structure described above provides an effect in that hydrogen can be prevented from infiltrating not only from upper and lower sides of the memory cell but also from side walls thereof.

The ferroelectric memory element in accordance with the present invention is characterized in that the hydrogen barrier film is an oxide including at least one element selected from aluminum, titanium, hafnium, zirconium, magnesium and tantalum.

The structure described above provides an effect in that the film thickness of the hydrogen barrier film can be made thin because the hydrogen barrier film exhibits a superior hydrogen barrier performance.

The ferroelectric memory element in accordance with the present invention is characterized in that the hydrogen barrier film is an oxide including at least one of elements in the ferroelectric layer.

The structure described above provides an effect in that the film thickness of the hydrogen barrier film can be made thin because the hydrogen barrier film exhibits a superior hydrogen barrier performance.

The ferroelectric memory element in accordance with the present invention is characterized in comprising a wiring layer that connects the memory cell array and the peripheral circuit section, wherein a material to be used as the wiring layer is deposited over the memory cell array insulated from the wiring layer.

The structure described above provides an effect in that the ferroelectric can be protected from deterioration by reduction in steps after the wiring step such as a passivation forming step, because the wiring material deposited on the memory cell array functions as a hydrogen barrier.

The ferroelectric memory element in accordance with the present invention is characterized in that a material to be used as the wiring layer has a surface that is oxidized.

The structure described above provides an effect in that the wiring material deposited over the memory cell array exhibits a superior hydrogen barrier function.

Method for Manufacturing Ferroelectric Memory Element

A method for manufacturing a ferroelectric memory element in accordance with the present invention pertains to a method for manufacturing a ferroelectric memory element including a memory cell array having memory cells, each of the memory cells composed of a ferroelectric capacitor, arranged in a matrix configuration, and is characterized in comprising the steps of:

(a) forming a hydrogen barrier film on a substrate;
(b) forming a first conductive layer on the hydrogen barrier film;
(c) forming a ferroelectric layer on the first conductive layer;
(d) forming a second conductive layer on the ferroelectric layer;
(e) patterning at least the ferroelectric layer and the second conductive layer;
(f) forming an insulation layer over the substrate to cover a laminated body including the first conductive layer, the ferroelectric layer and the second conductive layer;
(g) removing the insulation layer until an upper surface of the second conductive layer is exposed;
(h) forming a third conductive layer having a predetermined pattern to partially overlap the second conductive layer; and
(i) forming a hydrogen barrier film over the substrate from above the third conductive layer.

According to the method described above, hydrogen barrier films are formed above and below the ferroelectric layer in a region where the first conductive layer and the third conductive layer intersect orthogonal to one another, and therefore the method provides an effect in that the ferroelectric layer can be isolated from a reducing atmosphere in succeeding steps.

A method for manufacturing a ferroelectric memory element in accordance with the present invention pertains to a method for manufacturing a ferroelectric memory element including a memory cell array having memory cells, each of the memory cells composed of a ferroelectric capacitor, arranged in a matrix configuration, and is characterized in comprising a connection process of connecting the memory cells and a peripheral circuit section, wherein the connection process includes the steps of:

(i) forming contact holes at predetermined positions in an interlayer insulation film over the memory cell array;
(j) depositing a wiring material on the interlayer insulation film;
(k) patterning the wiring material to separate the wiring material into a wiring material over the memory cell array and a wiring region to connect the contact holes; and
(l) oxidizing only a surface of the wiring material.

According to the method described above, the wiring material whose surface is oxidized is deposited over the memory cell, and therefore the method provides an effect in that this material can be used as a hydrogen barrier film in succeeding steps.

The method for manufacturing a ferroelectric memory element in accordance with the present invention is characterized in that the step (I) is conducted by a heat treatment in an oxygen atmosphere.

The method described above provides an effect in that the surface of the wiring material can be oxidize while the characteristics of the ferroelectric layer can be recovered at the same time because the ferroelectric layer is also heated.

The method for manufacturing a ferroelectric memory element in accordance with the present invention is characterized in that the step (l) is conducted by exposure to oxygen plasma.

According to the method described above, because the wiring material is oxidized without being heated, the method provides an effect in that a material of a low melting point can be used as the wiring material.

DETAILED DESCRIPTION

Embodiments of the present invention are described below with reference to the accompanying drawings.

Embodiments

Device Structure

Figure 1:
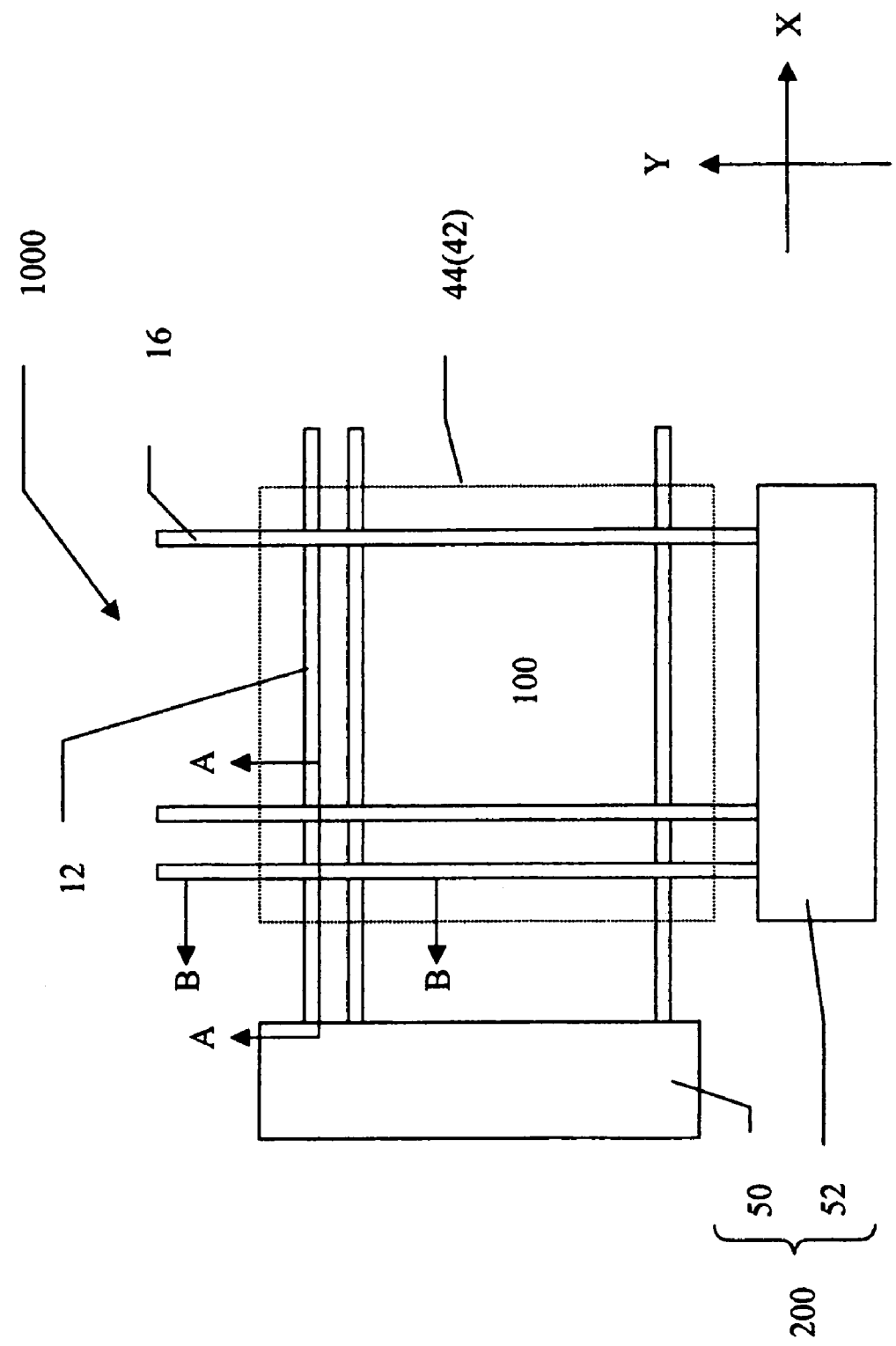
FIG. 1 is a plan view schematically showing a ferroelectric memory device in accordance with an embodiment of the present invention.
Figure 2:
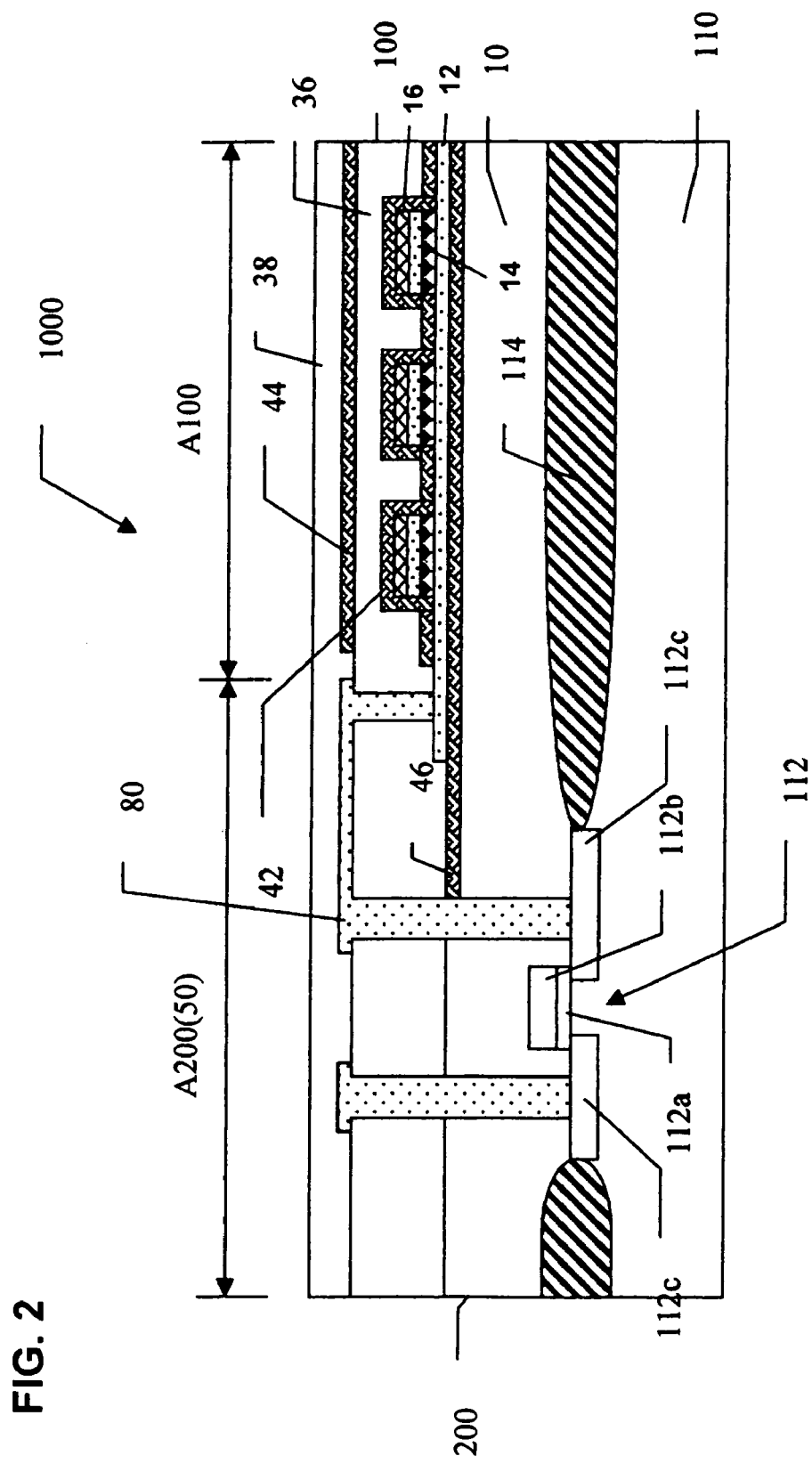
FIG. 2 is a cross-sectional view schematically showing a part of the ferroelectric memory device taken along a line A-A in FIG. 1.
Figure 3:
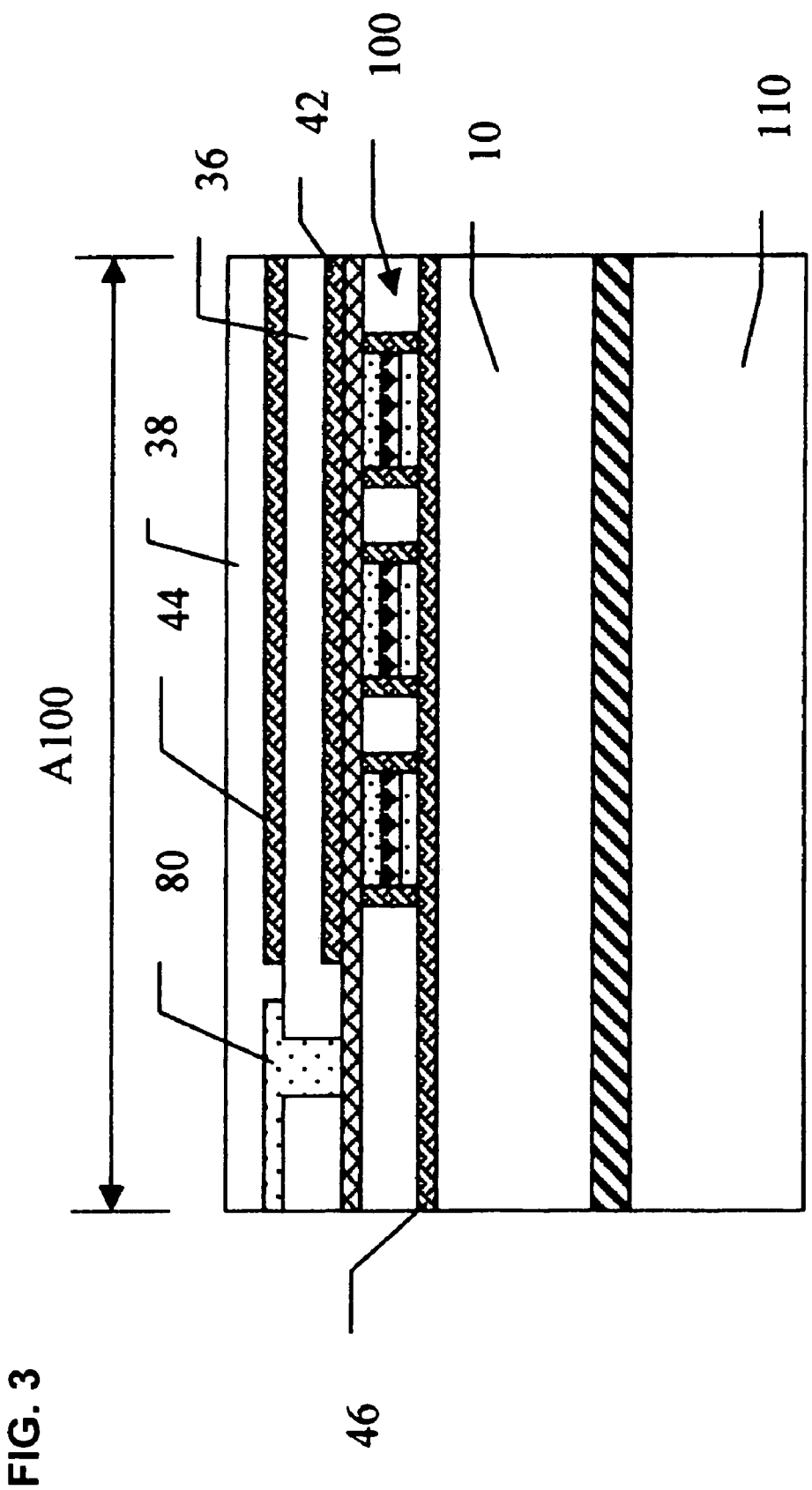
FIG. 3 is a cross-sectional view schematically showing a part of the ferroelectric memory device taken along a line B-B in FIG. 1.
Figure 4:
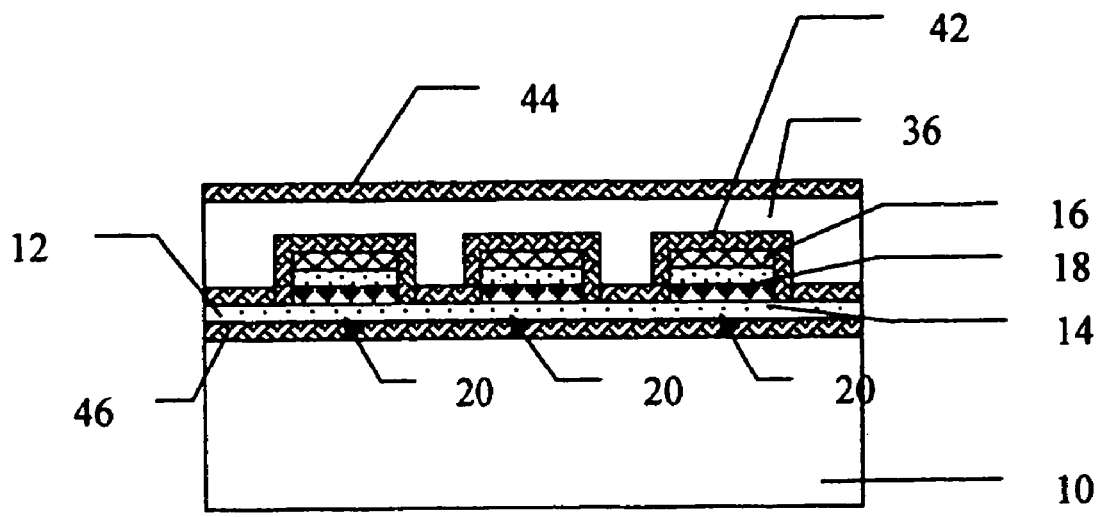
FIG. 4 is an enlarged schematic cross-sectional view of a memory cell in FIG. 2.
Figure 5:
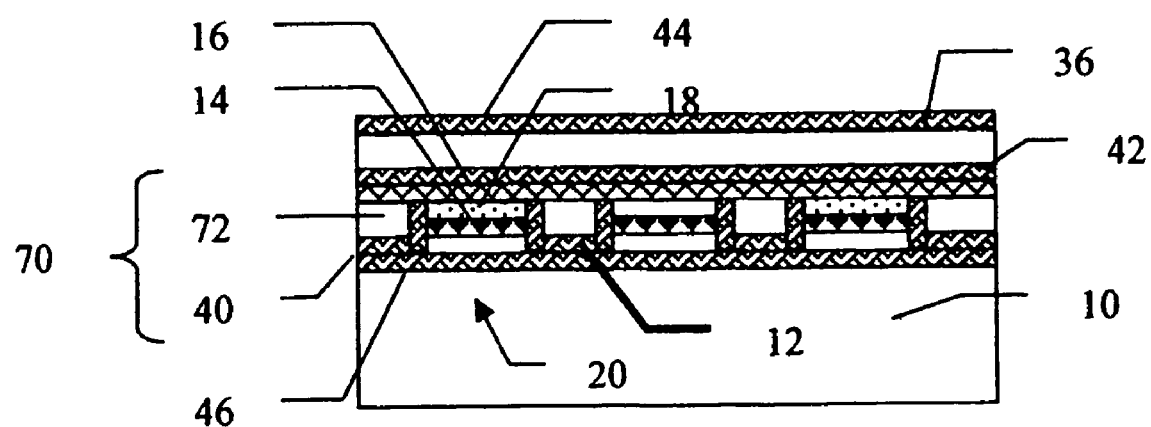
FIG. 5 is an enlarged schematic cross-sectional view of a memory cell in FIG. 3.

FIG. 1 is a plan view schematically showing a ferroelectric memory element, and FIG. 2 is a cross-sectional view schematically showing a part of a ferroelectric memory device taken along a line A-A in FIG. 1. FIG. 3 is a cross-sectional view schematically showing a part of the ferroelectric memory device taken along a line B-B in FIG. 1. FIG. 4 is an enlarged schematic cross-sectional view of a memory cell in FIG. 2. FIG. 5 is an enlarged schematic cross-sectional view of a memory cell in FIG. 3.

A ferroelectric memory device 1000 has a memory cell array 100 and a peripheral circuit section 200. Further, the memory cell array 100 and the peripheral circuit section 200 are formed in different layers, respectively. The peripheral circuit section 200 is formed in an area outside of the memory cell array 100. Concretely, a forming region A200 of the peripheral circuit section is provided in an area outside of a forming region A100 of the memory cell array. In this example, the peripheral circuit section 200 is formed in the lower layer and the memory cell array 100 is formed in the upper layer. As a concrete example of the peripheral circuit section 200, a Y-gate, a sense amplifier, a I/O buffer, a X-address decoder, a Y-address decoder, and an address buffer can be enumerated.

The memory cell array 100 includes lower electrodes (word lines) 12 for selection of rows, and upper electrodes (bit lines) 16 for selection of columns, which are disposed orthogonal to one another. More specifically, the lower electrodes 12 are arranged at a prescribed pitch along a direction X, and the upper electrodes 16 are arranged at a prescribed pitch along a direction Y orthogonal to the direction of X. It is noted that the lower electrodes 12 may be bit lines, and the upper electrodes 16 may be word lines.

The memory cell array 100 is provided over a first interlayer insulation layer 10 with a bottom hydrogen barrier film 46 being interposed between them, as shown in FIG. 2 and FIG. 3. More specifically, as shown in FIG. 4 and FIG. 5, the memory cell array 100 is provided over the first interlayer insulation layer 10 with the bottom hydrogen barrier film 46 being interposed between them, and includes a lower electrode 12, a ferroelectric layer 14 that composes a ferroelectric capacitor, a middle electrode 18, and an upper electrode (upper electrode) 16, which are laminated. The ferroelectric layer 14 and the middle electrode 18 are provided in an area where the lower electrode 12 and the upper electrode 16 intersect one another. In other words, memory cells composed of ferroelectric capacitor 20 are formed at intersecting regions of the lower electrodes 12 and the upper electrodes 16.

It is noted here that the bottom hydrogen barrier film 46 provided under the memory cell area functions to intercept hydrogen generated in steps to be conducted later from infiltrating from the substrate side to the lower electrode side. By this, the ferroelectric layer 14 in the memory cell region is prevented from being deteriorated by reduction due to hydrogen that might otherwise infiltrate from the lower electrode side and reach the ferroelectric layer 14. An oxide of aluminum, titanium, hafnium, zirconium, magnesium or tantalum can be enumerated as a material of the bottom hydrogen barrier film 46. Not only an oxide of a single element, but a complex oxide including two or more oxides of them can be used. In both of the cases, it is expected to achieve an excellent hydrogen barrier function.

As shown in FIG. 5, an insulation layer 70 is formed to cover at least the lower electrode 12 in the ferroelectric capacitor 20. The insulation layer 70 is provided under the upper electrode 16. Short-circuit of the lower electrode 12 with the middle electrode 18 or with the upper electrode 16 is prevented by the insulation layer 70 being provided. The insulation layer 70 can have a laminated structure of a first hydrogen barrier film 40 having an insulation property and a first insulation layer 72. By forming the first hydrogen barrier film 40, hydrogen that is generated at the time of forming the insulation layer 40 is prevented from reducing the ferroelectric layer 14 of the ferroelectric capacitor 20. It is noted that generation of hydrogen may not need to be considered depending on the method of forming the insulation layer 70, and in such a case, the first hydrogen barrier film 40 may not have to be formed.

Moreover, as shown in FIG. 4 and FIG. 5, a second hydrogen barrier film 42 is formed to cover at least the entire surface of the memory cell array 100. By forming the second hydrogen barrier film 42, the ferroelectric layer 14 of the ferroelectric capacitor 20 can be prevented from being reduced by hydrogen that is generated in a step after the second hydrogen barrier film 42 has been formed (for example, in a passivation film forming step). It is noted here that, if the material of the first hydrogen barrier film 40 or the second hydrogen barrier film 42 has an insulation property and a hydrogen barrier function, the material is not particularly limited. Particularly, an oxide of aluminum, titanium, hafnium, zirconium, magnesium or tantalum can be enumerated as a material that has an excellent hydrogen barrier performance, like the bottom hydrogen barrier film 46 described above. Not only an oxide of a single element, but also a complex oxide including two or more oxides of them can be used. Also, an oxide that contains the composition element of the ferroelectric layer 14 can be enumerated as a candidate of the hydrogen barrier material. More specifically, when SBT ($SrBi_2Ta_2O_9$) is used as a ferroelectric layer, an oxide that consists of strontium and tantalum, an oxide that consists of strontium and bismuth, an oxide that consists of bismuth and tantalum and the like are suitable. Also, an oxide of a single element of strontium, bismuth or tantalum may be used. Moreover, it is expected that SBT itself also provides the hydrogen barrier performance.

It is possible that the second hydrogen barrier film 42 may not be formed in the forming region A200 of the peripheral circuit section. By this, while reduction by hydrogen of the ferroelectric layer 16 in the memory cell array 100 can be suppressed, the peripheral circuit section 200 can be recovered with hydrogen.

Moreover, as shown in FIG. 2 and FIG. 3, a first protection layer 36 is formed on the first interlayer insulation layer 10 to cover the memory cell array 100. In addition, a second protection layer 38 with a high insulating property is formed on the first protection layer 36 to cover the second wiring layer 40.

A third hydrogen barrier film 44 is formed between the first protection layer 36 and the second protection layer 38. The third hydrogen barrier film 44 can be formed at least in the memory cell array region A100.

By forming the third hydrogen barrier film 44, the ferroelectric layer 14 in the memory cell array 100 can be more securely prevented from being reduced by hydrogen that is generated in a step after the third hydrogen barrier film 44 has been formed (for example, in a passivation film forming step). The third hydrogen barrier film 44 is not particularly limited to any material as long as it has a hydrogen barrier function, and can be insulating or non-insulating. When the third hydrogen barrier film 44 consists of an insulating material, the material of the third hydrogen barrier film 44 can be selected from those materials enumerated for the second hydrogen barrier film 42. Also, when the third hydrogen barrier film 44 consists of a conductive material, titanium, iridium oxide, titanium nitride, and aluminum can be enumerated as the material of the third hydrogen barrier film 44.

Also, it is possible that the third hydrogen barrier film 44 may not be formed in the peripheral circuit region A200. By this, while reduction by hydrogen of the ferroelectric layer 16 in the memory cell array 100 can be suppressed, the peripheral circuit section 200 can be recovered with hydrogen.

The peripheral circuit 200 includes MOS transistors 112 formed on the semiconductor substrate 110, as shown in FIG. 2. The MOS transistor 112 has a gate insulation layer 112a, a gate electrode 112b, and source/drain regions 112c. The MOS transistors 112 are isolated from one another by an element isolation area 114. The first interlayer insulation layer 10 is formed on the semiconductor substrate 110 on which the MOS transistor 112 is formed. Further, the peripheral circuit section 200 and the memory cell array 100 are electrically connected to one another by the first wiring layer 40.

Next, an example of writing and reading operations in the ferroelectric memory device 1000 is described.

First, in the reading operation, a read voltage "V0" is impressed to a capacitor of a selected cell. This serves as a writing operation to write '0' at the same time. At this moment, a current that flows on a selected bit line or a potential on the bit line when it is brought to a high impedance is read by a sense amplifier. At this moment, a predetermined voltage is impressed to capacitors of non-selected cells to prevent cross-talk at the time of reading.

In the writing operation, a voltage "−V0" is impressed to a capacitor of a selected cell, when writing '1.' When writing '0,' a voltage that does not invert the polarization of a selected cell is impressed to a capacitor of the selected cell, to retain the "0" state written at the time of reading operation. At this moment, a predetermined voltage is impressed to capacitors of non-selected cells to prevent cross-talk at the time of writing.

Actions and Effects of Device

Actions and effects of the ferroelectric memory device 1000 are described below.

In the present embodiment, the second hydrogen barrier film 42 is provided to cover at least the entire surface of the memory cell array 100. As a result, the following actions and effects can be obtained.

By forming the second hydrogen barrier film 42, reduction of the ferroelectric layer 14 by hydrogen that is generated in a step after the second hydrogen barrier film 42 has been formed can be suppressed.

Further, because the second hydrogen barrier film 42 is formed over the entire surface, the second hydrogen barrier film 42 does not need to be patterned into a minute pattern. As a result, the second hydrogen barrier film 42 can be readily patterned.

In the present embodiment, the third hydrogen barrier film 44 is provided on the first protective layer 36 at least in the forming region A100 of the memory cell array. As a result, actions and effects similar to the actions and effects described in conjunction with the second hydrogen barrier film 42 can be achieved.

In the present embodiment, the bottom hydrogen barrier film 46 is disposed below the lower electrode 12 over the entire surface in at least the memory cell array region. As a result, the following actions and effects can be obtained.

Hydrogen generated in a step after the ferroelectric layer 14 has been formed can be prevented from reaching the ferroelectric layer from the substrate side.

When a precious metal such as platinum is used as a material of the lower electrode 12, its adhesion with the first interlayer insulation layer 10 often becomes deteriorated depending on the film forming condition of the lower electrode 12. When the bottom hydrogen barrier film 46 is provided between the lower electrode 12 and the first interlayer insulation layer 10, like the present embodiment example, the bottom hydrogen barrier film 46 functions as an adhesion layer for the lower electrode 12 and the first interlayer insulation layer 10, such that the adhesion between the lower electrode 12 and the first interlayer insulation layer 10 improves.

When the ferroelectric layer 14 is formed with an area larger than the lower electrode 12, a part of the area of the ferroelectric film 14 is disposed over the first interlayer insulation layer 10. At this time, when Pb(Zr,Ti)O$_3$ (PZT) is used as a material of the ferroelectric layer 14, Pb in the PZT reacts with Si in the first interlayer insulation layer 10 such that lead glass is formed. The bottom hydrogen barrier film 46, when formed over the entire surface below the lower electrode 12 like the present embodiment example, also functions as a layer to prevent diffusion of Pb.

The ferroelectric layer 14 is formed in an intersecting region of the upper electrode 16 and the lower electrode 12. For this reason, lines of electric force can be suppressed from extending out from the capacitor. As a result, the electric field in the ferroelectric layer 14 can be enhanced, such that a voltage necessary to make the ferroelectric layer 14 to a constant polarization value can be suppressed. In other words, the hysteresis loop can be brought close to a square shape. As a result, characteristics of the ferroelectric capacitor 20 can be improved by the ferroelectric memory device 1000.

Process

Next, an example of a method for manufacturing the ferroelectric memory device described above is described. FIGS. 6 through 14 are cross-sectional views schematically showing steps of manufacturing a ferroelectric memory device 1000. It is noted that FIGS. 7 through 14 are cross-sectional views focusing solely on a memory cell array region.

Figure 6:
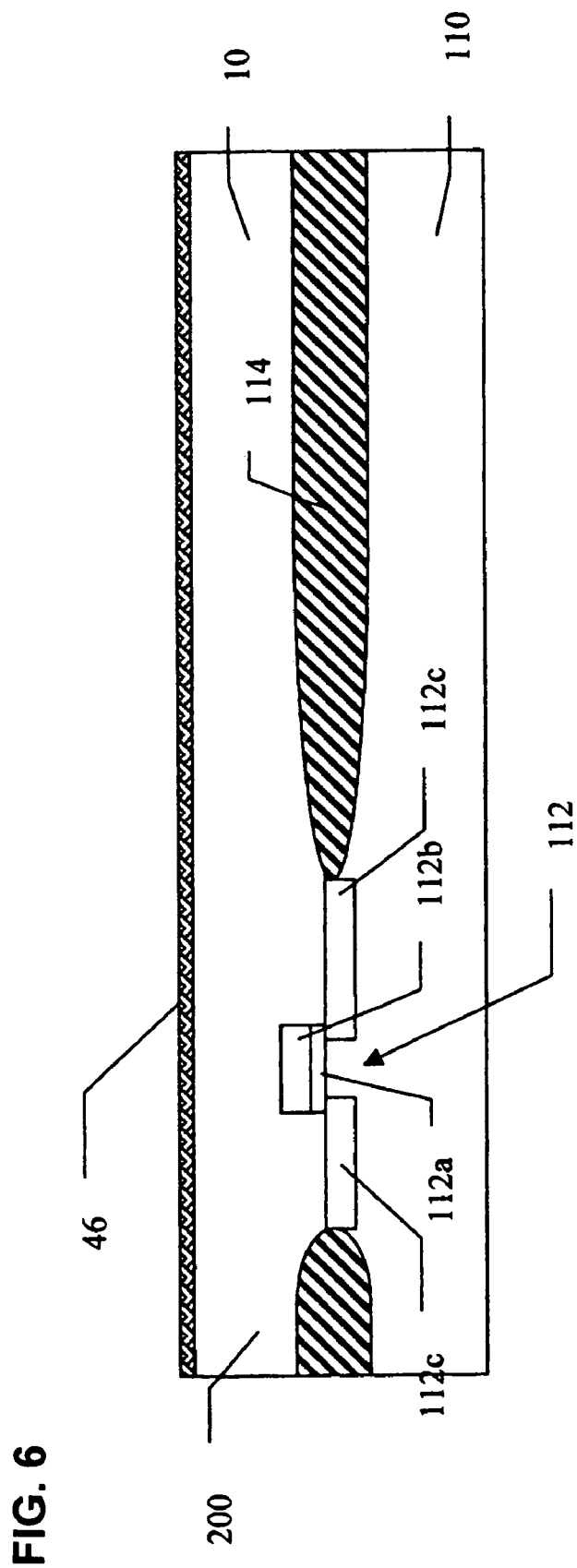
FIG. 6 is a cross-sectional view schematically showing a step of manufacturing a ferroelectric memory device.

A peripheral circuit 200 is formed by using a known LSI process, as shown in FIG. 6. More specifically, a MOS transistor 112 is formed on a semiconductor substrate 110. For example, an element isolation region 114 is formed by using a trench isolation method, a LOCOS method, or the like in a prescribed area on the semiconductor substrate 110. Next, a gate insulation layer 112a and a gate electrode 112b are formed, and then source/drain regions 112c are formed by doping impurities in the semiconductor substrate 110.

Next, a memory cell array 100 is formed on a first interlayer insulation layer 10. A method for forming the memory cell array is described below with reference to FIGS. 7 through 14.

Figure 7:
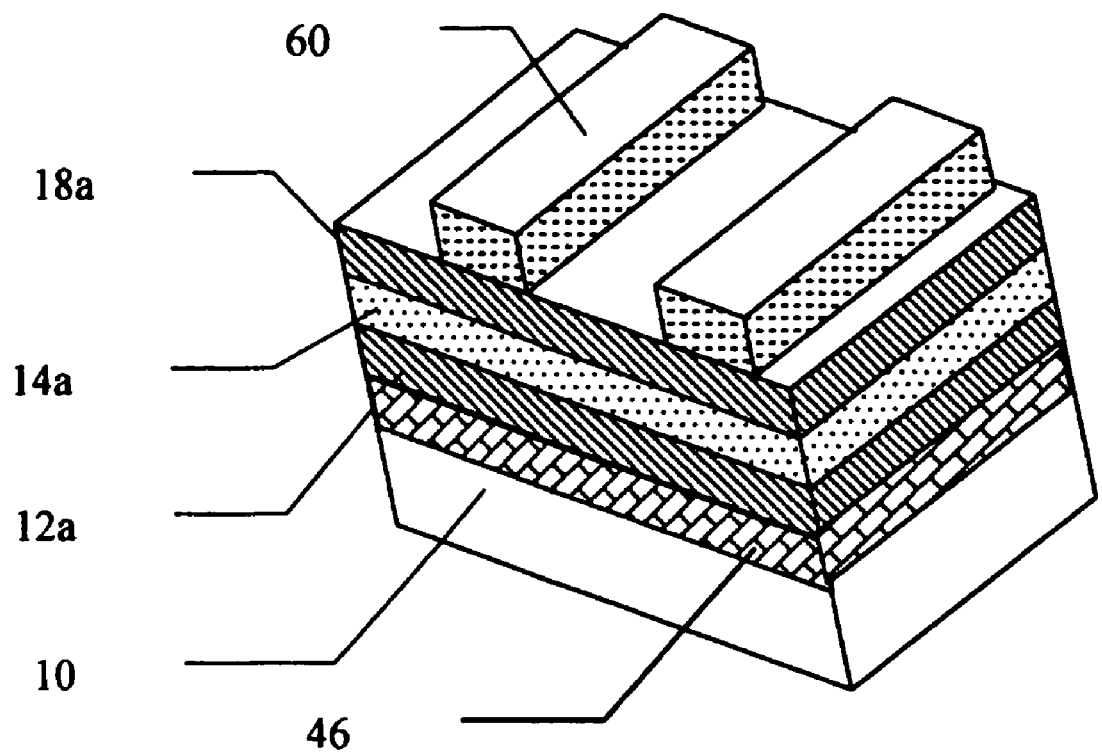
FIG. 7 is a cross-sectional view schematically showing a step of manufacturing the ferroelectric memory device.

First, a bottom hydrogen barrier film 46 is formed on the first interlayer insulation layer 10, as shown in FIG. 7. Any material can be permitted for the bottom hydrogen barrier film 46 without any particular limitation, as long as it has a hydrogen barrier property and nonconductivity. An oxide of aluminum, titanium, hafnium, zirconium, magnesium or tantalum can be enumerated. Not only an oxide of a single element, but a complex oxide including two or more oxides of them can be used. As the film forming method, a sputter method, a vacuum deposition method, a CVD method or the like can be used.

A first conductive layer 12a for the lower electrode 12 is formed on this. As a material of the first conductive layer 12a, any material that can become an electrode of a ferroelectric capacitor is acceptable without any particular limitation. For example, Ir, $IrO_x$, Pt, $RuO_x$, $SrRuO_x$, and $LaSrCoO_x$ can be enumerated as a material of the first conductive layer 12a. Also, the first conductive layer 12a can be single-layer or a laminated body of two or more layers. A sputter method, a vacuum deposition method, a CVD method or the like can be used as the method for forming the first conductive layer 12a.

Next, a ferroelectric layer 14 is formed on the first conductive layer 12a. As a material of the ferroelectric layer 14a, any arbitrary composition is applicable if it exhibits the ferroelectric property and can be used as an insulation layer of a capacitor. For example, PZT ($PbZr_zTi_{1-z}O_3$) and SBT ($SrBi_2Ta_2O_9$) can be enumerated as the ferroelectric. In addition, a composition having any of these materials and a metal such as niobium, nickel, magnesium or the like added is applicable. As a method of forming the ferroelectric layer 14a, for example, a spin coat method or a dipping method that uses sol-gel raw materials or MOD raw materials, a sputter method, an MOCVD method, a laser ablation method, and the like can be enumerated.

Next, a second conductive layer 18a for a middle electrode 18 is formed on the ferroelectric layer 14a. The material of the first conductive layer 12a and the method for forming the same can be similarly applied to those of the second conductive layer 18a.

Next, a mask layer 60 is formed over the entire surface, and the mask layer 60 is patterned by lithography and etching. More specifically, the mask layer 60 is formed on a region where a lower electrode 12 is to be formed. As the material of the mask layer 60, any material that can function as a mask when the second conductive layer 18a, the ferroelectric layer 14a, and the first conductive layer 12a are etched can be used without any particular limitation and, for example, silicon nitride, silicon oxide, and titanium nitride can be enumerated. For example, the mask layer 60 can be formed by a CVD method.

Figure 8:
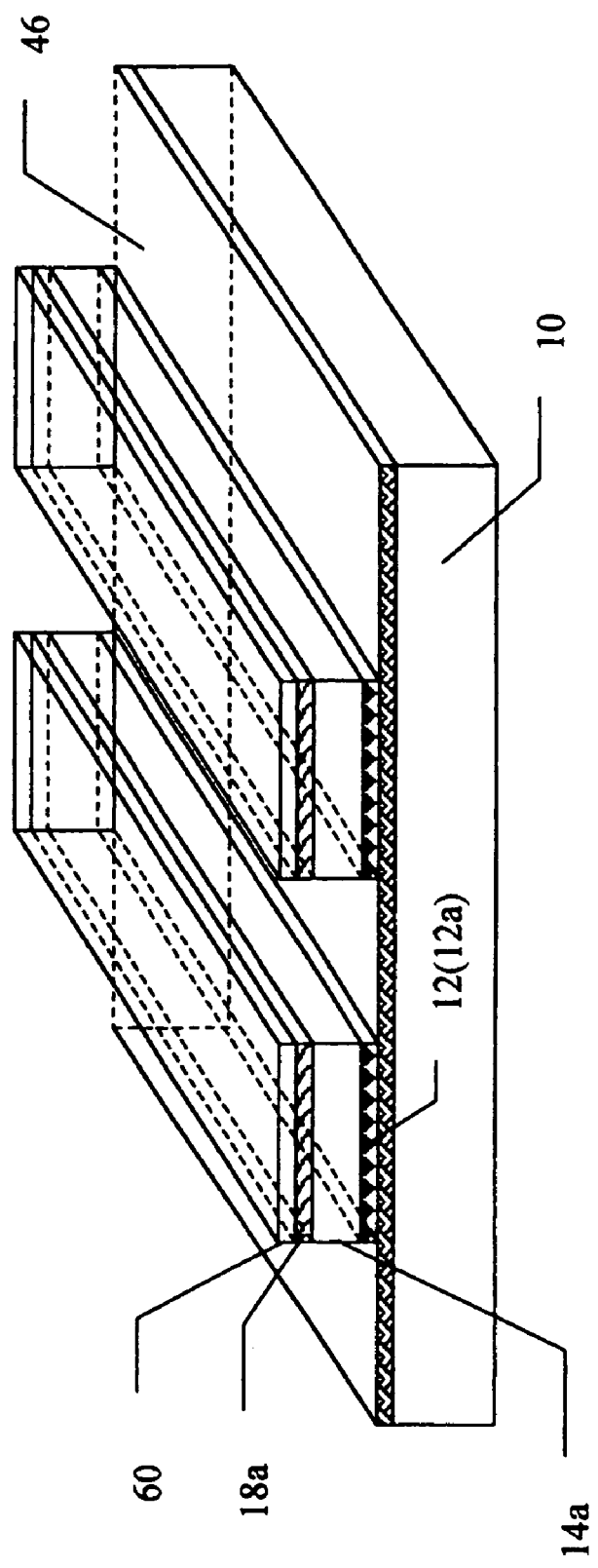
FIG. 8 is a cross-sectional view schematically showing a step of manufacturing the ferroelectric memory device.

Next, as shown in FIG. 8, by using the mask layer 60 as a mask, the second conductive layer 18a, the ferroelectric layer 14a, and the first conductive layer 12a are etched, thereby patterning the second conductive layer 18a, the ferroelectric layer 14a, and the first conductive layer 12a. A lower electrode 12 having a predetermined pattern is formed through patterning the first conductive layer 12a. As the etching method, RIE, sputter etching, plasma etching, and the like can be enumerated.

Figure 9:
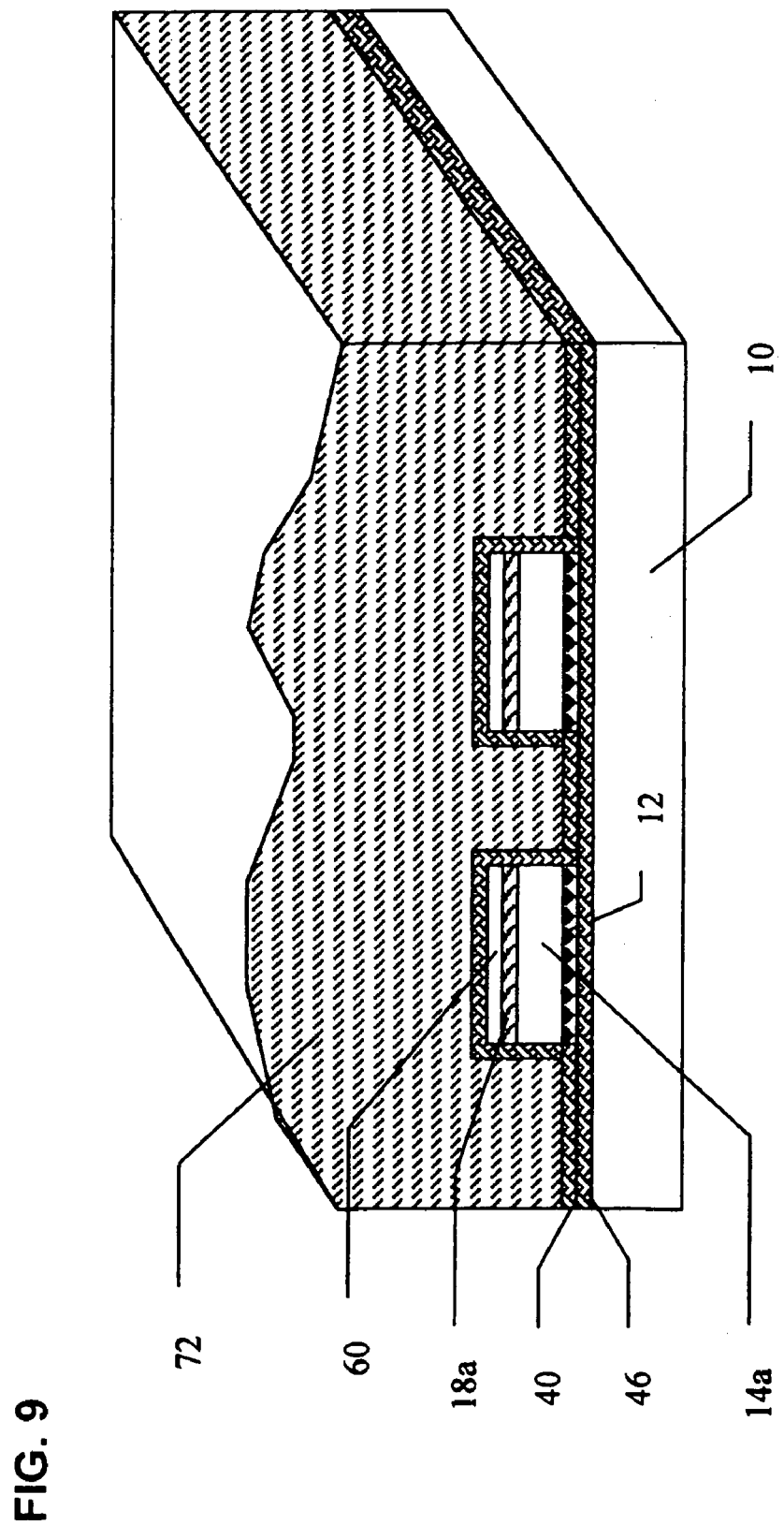
FIG. 9 is a cross-sectional view schematically showing a step of manufacturing the ferroelectric memory device.

Next, as shown in FIG. 9, a first hydrogen barrier film 40 is formed over the entire surface. As a material of the first hydrogen barrier film 40, any material that can prevent the ferroelectric layer 14a from being reduced by hydrogen can be used without any particular limitation and, for example, raw materials similar to those of the above-described bottom hydrogen barrier film 46 can be used. A sputter method, a CVD method, a laser ablation method, and the like can be enumerated as the method for forming the first hydrogen barrier film 40.

Next, a first insulation layer 72 is formed over the entire surface. As a material of the first insulation layer 72, any material that provides the same etching rate as that of the mask layer 60 in a later step of etching back the first insulation layer can be used without any particular limitation. For example, as a material of the first insulation layer 72, silicon oxide, silicon nitride, aluminum oxide, and tantalum oxide can be enumerated. If the material and the formation method for the first insulation layer 72 are the same as the material and the formation method for the mask layer 60, the first insulation layer 72 and the mask layer 60 can be readily made to have the same etching rate. The first insulation layer 72 covers each laminated body of the lower electrode 12, the ferroelectric layer 14a, the second conductive layer 18a, and the mask layer 60 (hereafter referred to as a "laminated body"), and is formed to fill gaps between the laminated bodies.

Figure 10:
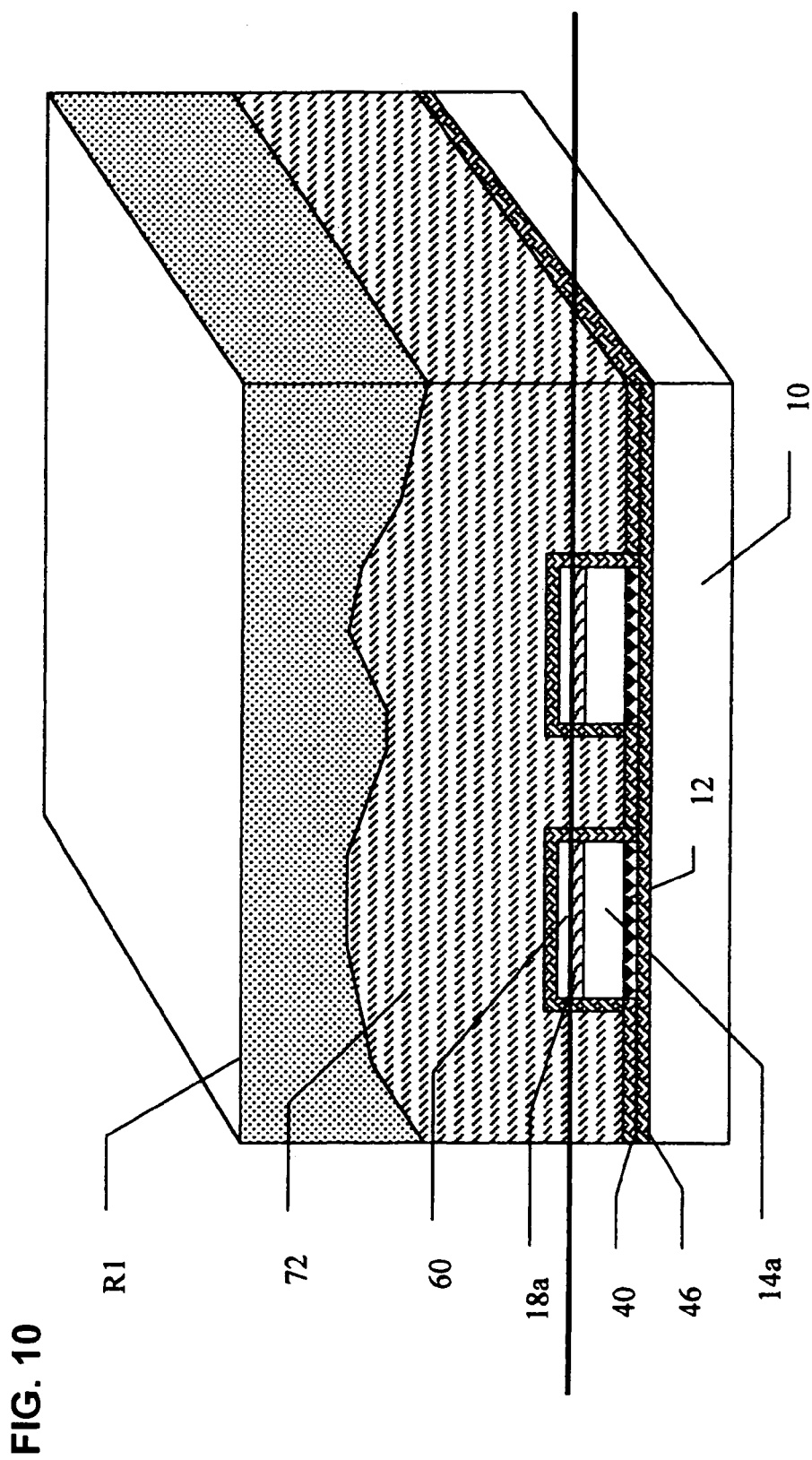
FIG. 10 is a cross-sectional view schematically showing a step of manufacturing the ferroelectric memory device.

Next, a resist layer R1 is formed on the first insulation layer 72, as shown in FIG. 10. The resist layer R1 is formed so that its upper surface becomes flat. The resist layer R12 can be formed by a spin coat method. The thickness of the resist layer R12 can be about twice the depth of the concave portion formed in the first insulation layer 72 (for example, 0.8 µm). When the first insulation layer 72 having a flat upper surface is formed by a coating method, the resist layer R1 may not be formed. Concretely, when the first insulation layer 72 is composed of a SOG (Spin On Glass) layer, the resist layer R1 does not need to be formed.

Figure 11:
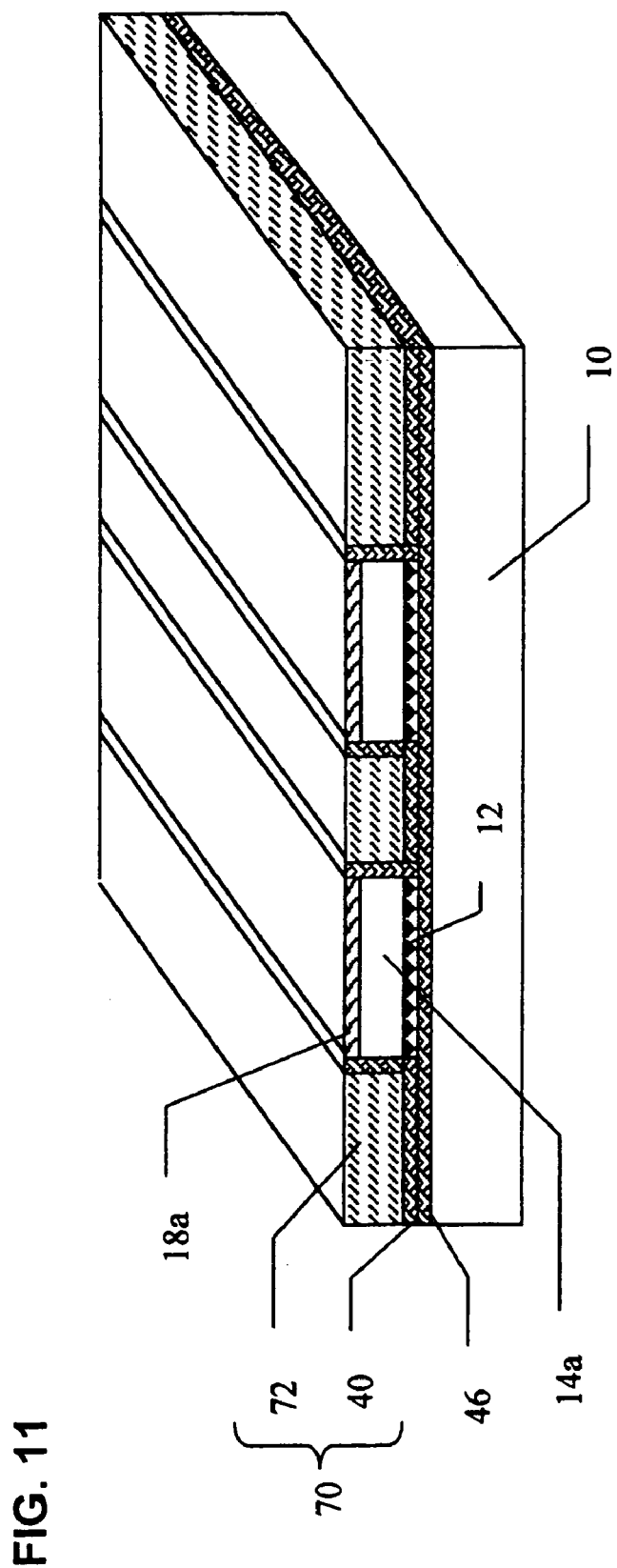
FIG. 11 is a cross-sectional view schematically showing a step of manufacturing the ferroelectric memory device.

Next, as shown in FIG. 11, the first insulation layer 72 and the resist layer R1 are etched back. At the same time as the etch-back, the mask layer 60 is removed, and the upper surface of the second conductive layer 18a is exposed. For example, the etching can be conducted by a dry etching method such as RIE. Moreover, the resist layer R1 and the first insulation layer 72 can be etched under conditions such that their etching rates become equal. For example, a mixed gas of $CHF_3$ and $O_2$ can be used as an etchant for the etching. The selection ratio of the resist layer R1 and the first insulation layer 72 can be controlled by the mixing ratio of $CHF_3$ and $O_2$. At the time of etching, an insulation layer 70 composed of the first insulation layer 72 and the first hydrogen barrier film 40 is formed to cover at least side walls of the lower electrode 12.

Figure 12:
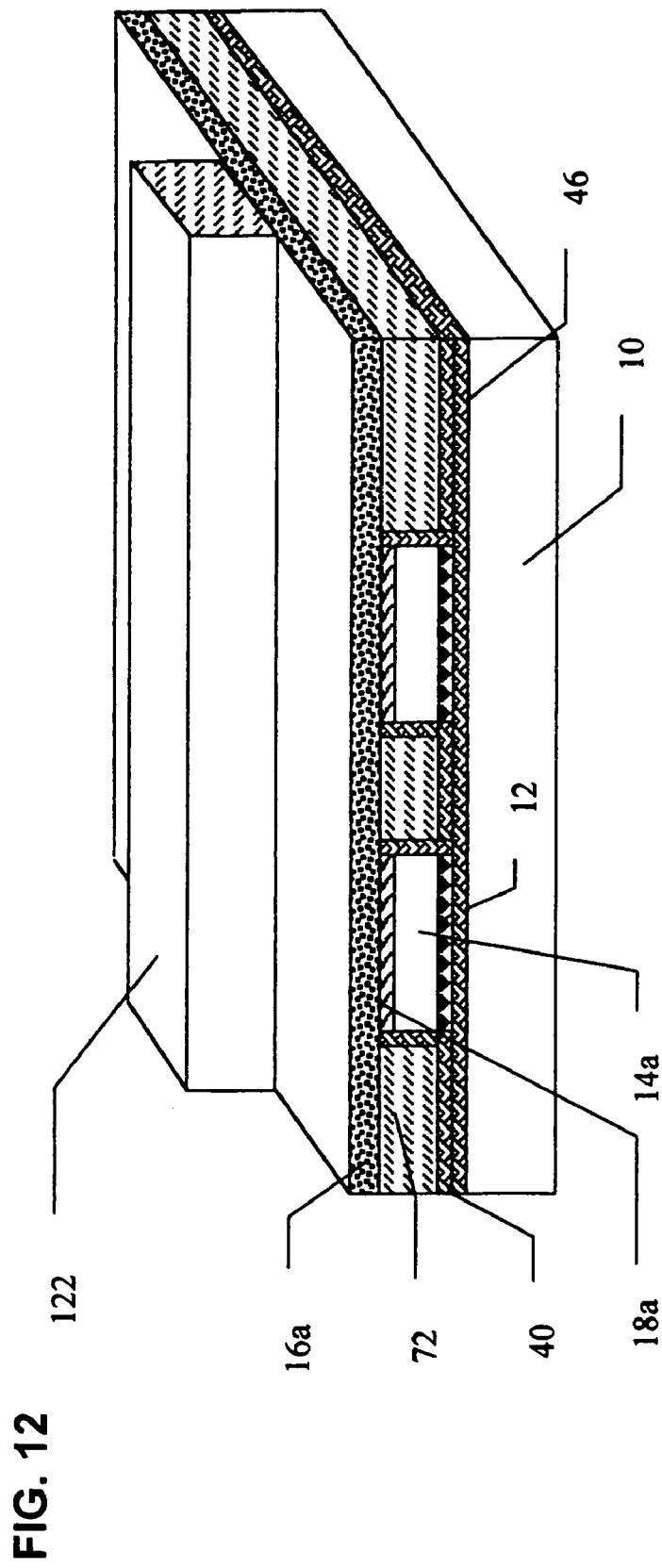
FIG. 12 is a cross-sectional view schematically showing a step of manufacturing the ferroelectric memory device.

Next, as shown in FIG. 12, a third conductive layer 16a is deposited on the entire surface. The material and the forming method for the third conductive layer 16a may be the same as the material and the forming method for the first conductive layer 12a, for example.

Next, a resist layer R2 having a prescribed pattern is formed on the third conductive layer 16a. The resist layer R2 is formed on a region where an upper electrode 16 is to be formed.

Figure 13:
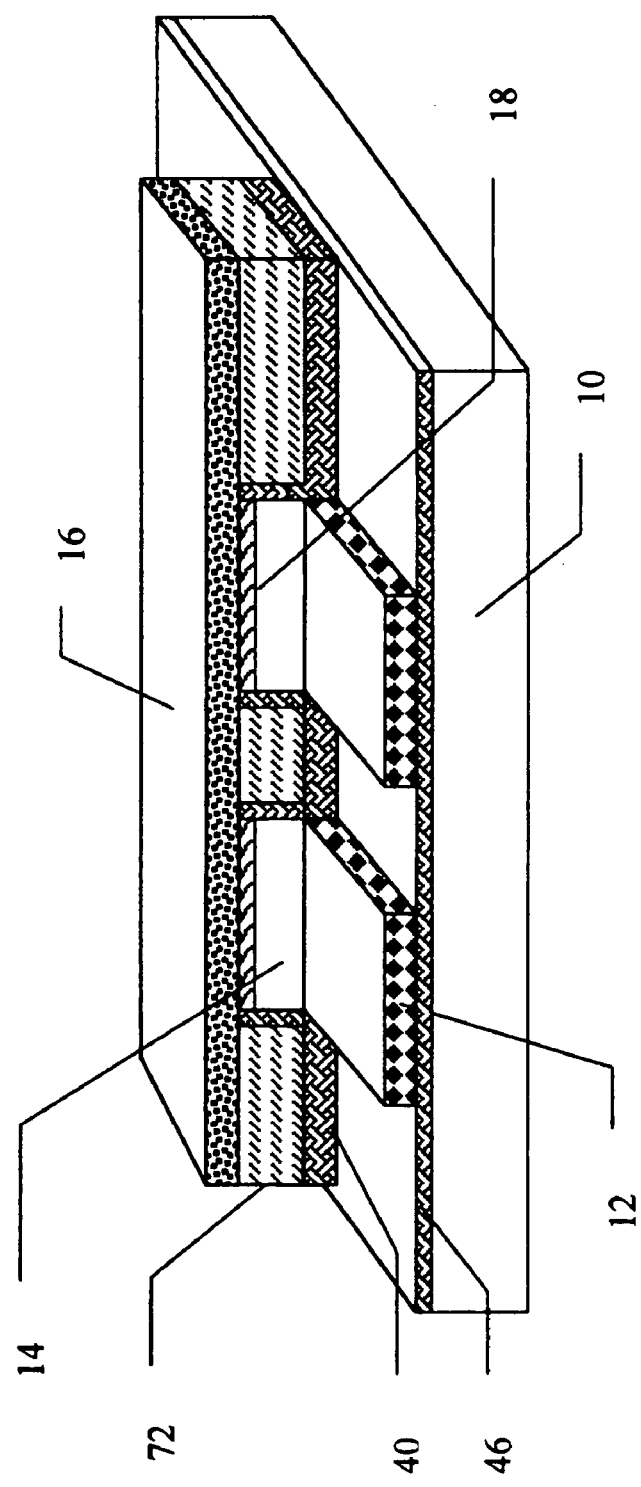
FIG. 13 is a cross-sectional view schematically showing a step of manufacturing the ferroelectric memory device.

Next, by using the resist layer R2 as a mask, the third conductive layer 16a, the second conductive layer 18a, the ferroelectric layer 14a, the first insulation layer 72, and the first hydrogen barrier film 40 are etched. In this manner, the upper electrode 16 is formed through patterning the third conductive layer 16a, as shown in FIG. 13. Also, through patterning the second conductive layer 18a and the ferroelectric layer 14a, a middle electrode 18 and a ferroelectric layer 14 are formed in an intersecting region of the upper electrode 16 and the lower electrode 12. The first insulation layer,72 and the first hydrogen barrier film 40 remain under the upper electrode 16 excluding the intersecting region of the upper electrode 16 and the lower electrode 12. Thus, a memory cell array 100 is formed.

Figure 14:
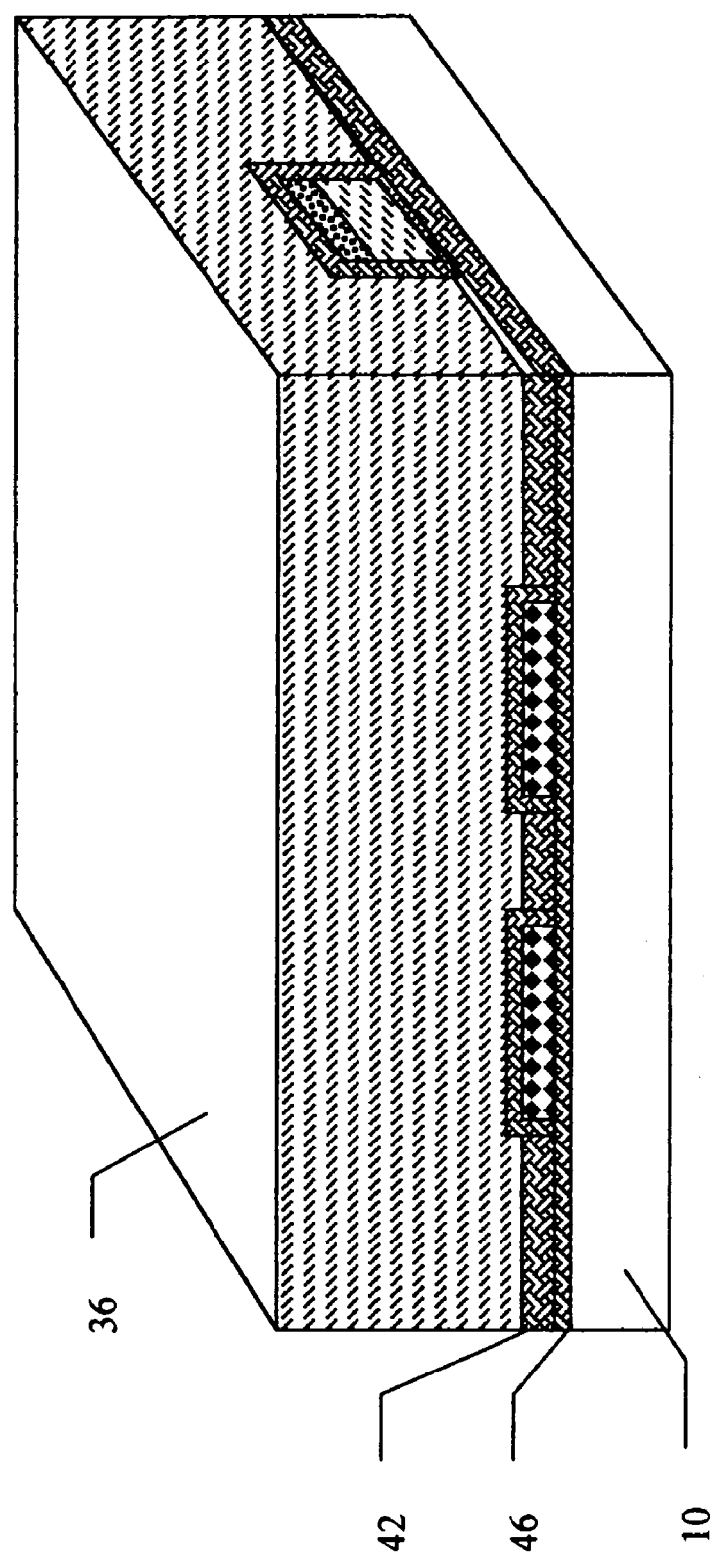
FIG. 14 is a cross-sectional view schematically showing a step of manufacturing the ferroelectric memory device.

Next, a second hydrogen barrier film 42 is formed, as shown in FIG. 1 and FIG. 14. As the material and the forming method for the second hydrogen barrier film 42, those for the first hydrogen barrier film 40 described above can be enumerated. In addition, oxides of the elements included in the ferroelectric layer 14 can be used as the second hydrogen barrier film. For example, when $Pb(Zr,Ti)O_3$ (PZT) is used as the ferroelectric layer 14, $TiO_x$ and $ZrO_x$ may be used. Alternatively, a complex oxide of these may be used. Moreover, PZT itself may be used.

Also, when $SrBi_2TaO_9$ (SBT) is used as the ferroelectric layer 14, an oxide that consists of strontium and tantalum, an oxide that consists of strontium and bismuth, an oxide that consists of bismuth and tantalum and the like are suitable. Also, an oxide of a single element of strontium, bismuth or tantalum may be used. Moreover, SBT itself can also be expected to achieve the hydrogen barrier performance.

The second hydrogen barrier film 42 is patterned in a manner to cover at least the entire surface of the memory cell array 100.

Next, a first protection layer 36 is formed on the second hydrogen barrier film 42 by a known method. The first protection layer is planarized if necessary.

Next, a third hydrogen barrier film 44 is formed on the first protective layer 36. As a method of forming the third hydrogen barrier film 44, the method indicated in conjunction with the first hydrogen barrier film 40 can be enumerated. The third hydrogen barrier film 44 is patterned to cover at least the entire surface of the memory cell array 100. A material similar to that of the second hydrogen barrier film can be used as a material of the third hydrogen barrier film.

Next, a second protection layer is formed over the first protection layer 36 and the third hydrogen barrier film 44.

Actions and Effects of the Process

According to this manufacturing method, the second conductive layer 18a is formed on the ferroelectric layer 14a. For this reason, in the step of etching back the first insulation layer 72 and the mask layer 60, the ferroelectric layer 14a would not come in contact with etchant because the ferroelectric layer 14a is covered with the second conductive layer 18a.

For this reason, the structure of the surface of the ferroelectric layer 14a does not become disorder, and the deterioration of characteristics can be suppressed. In other words, damages that may be inflicted on the ferroelectric capacitor can be suppressed.

MODIFICATION EXAMPLE

In the embodiment described above, the second hydrogen barrier film 42 and the third hydrogen barrier film 44 are formed. However, only one of the second hydrogen barrier film 42 and the third hydrogen barrier film 44 may be provided.

Figure 15:
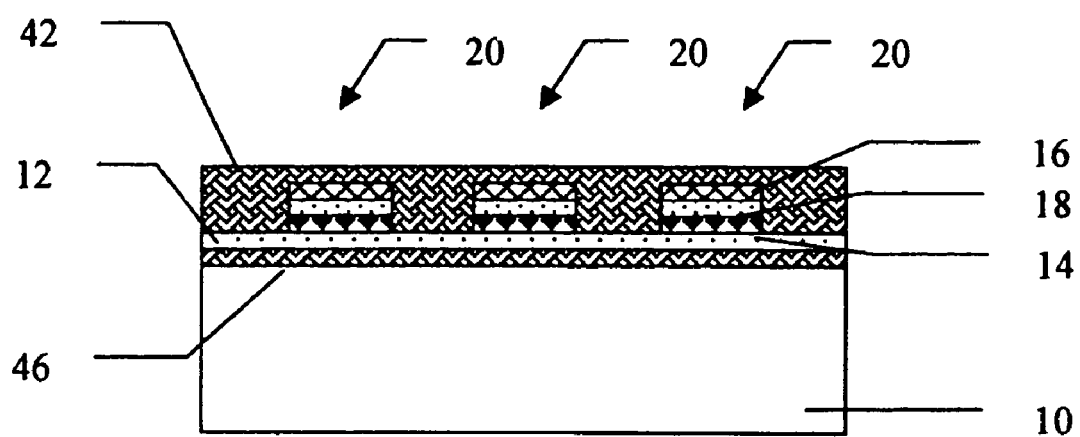
FIG. 15 is a cross-sectional view schematically showing a part of a ferroelectric memory device in accordance with a modification example.
Figure 16:
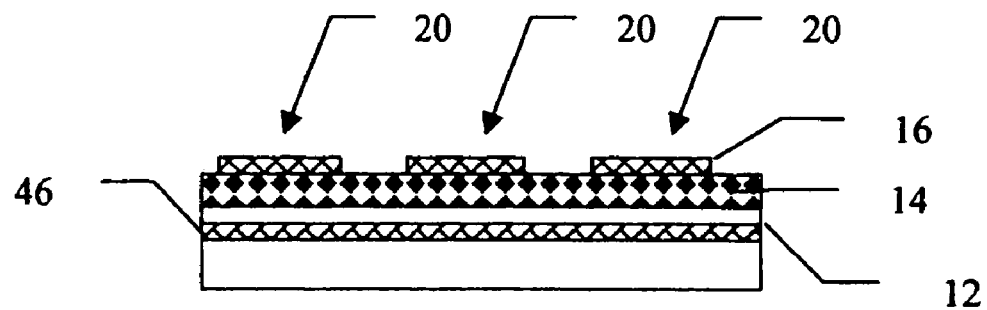
FIG. 16 is a cross-sectional view schematically showing a part of a ferroelectric memory device in accordance with a modification example.

As shown in FIG. 15, the second hydrogen barrier film 42 may be made to function as a protection layer (interlayer insulation layer).

In the embodiment described above, the ferroelectric layer 14 is formed in an intersection region of the upper electrode 12 and the lower electrode 16. However, without being limited to this, ferroelectric layers 14 of adjacent ferroelectric capacitors 20 can be mutually continuous. For example, in another embodiment, the ferroelectric layer 14 may be formed over the entire surface of the forming region A100 of the memory cell array.

Figure 17:
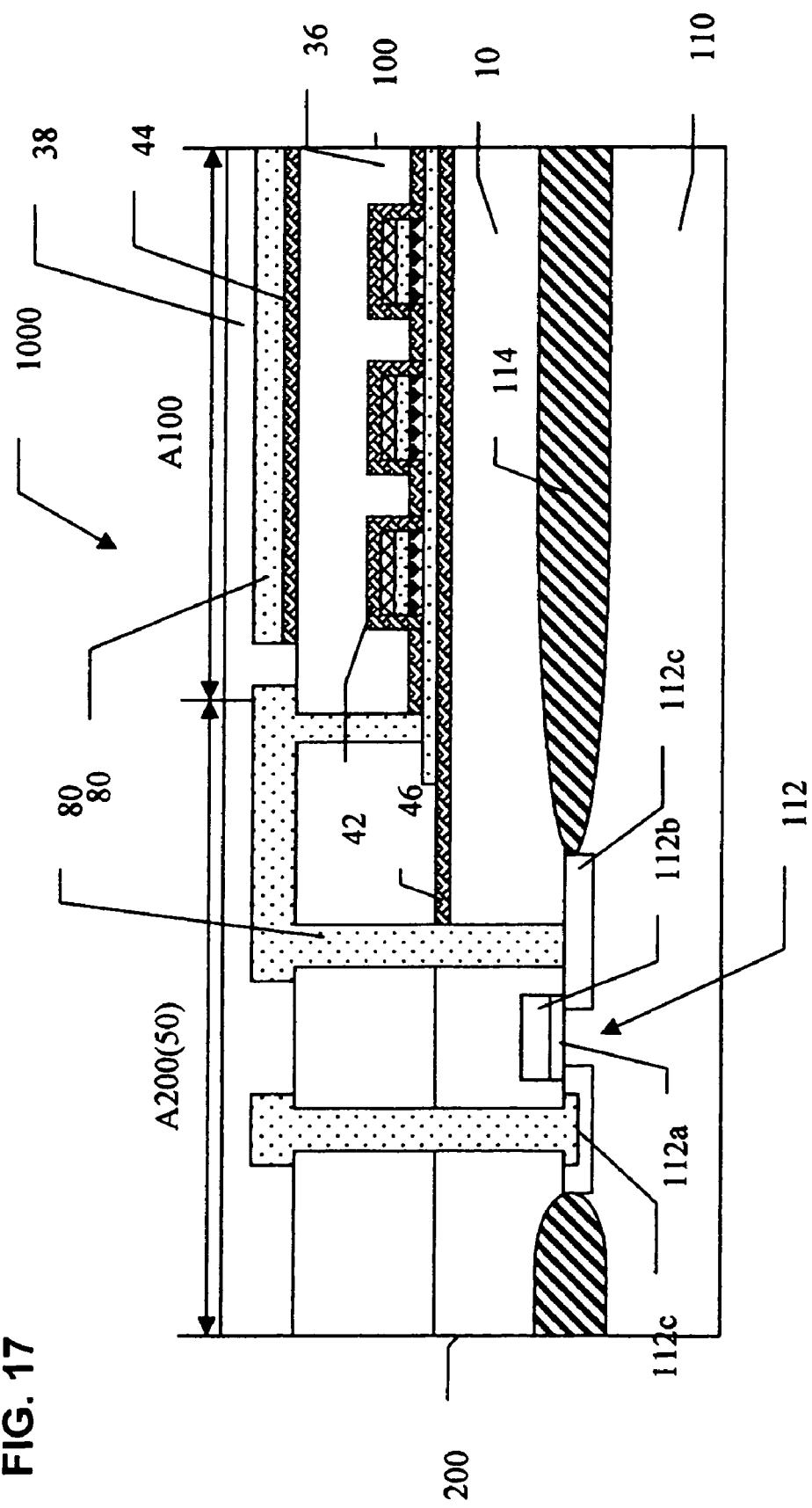
FIG. 17 is a cross-sectional view schematically showing a part of a ferroelectric memory device in accordance with a modification example.
Figure 18:
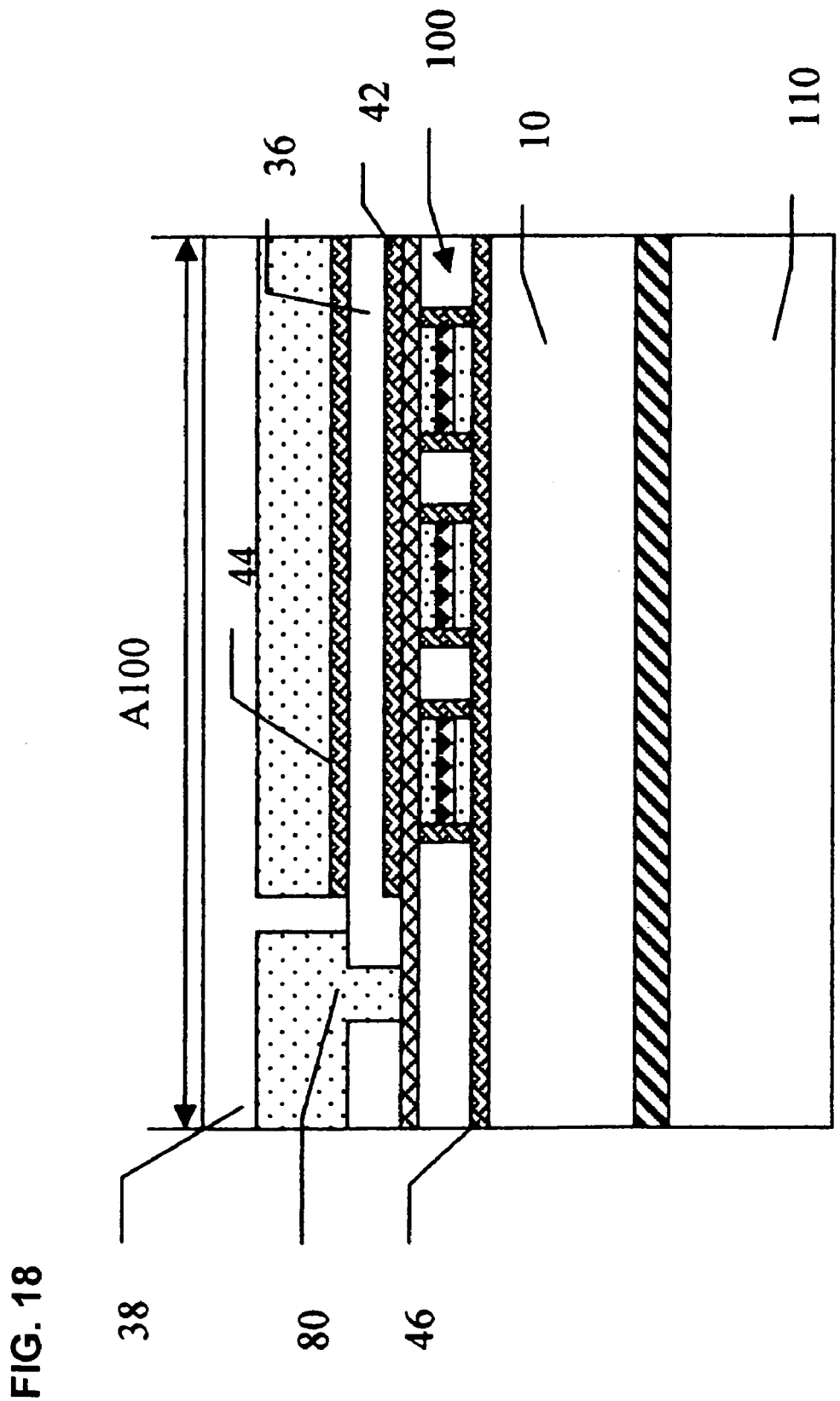
FIG. 18 is a cross-sectional view schematically showing a part of a ferroelectric memory device in accordance with a modification example.

A connection example of a MOS transistor 112 and a memory cell array 100 is shown in FIG. 17. As shown in FIG. 17, a wiring layer 80 defines a connection layer between the memory cell array 100 and the MOS transistor 112. The wiring layer 80 can be left on the memory cell array, separated from the wiring region in the patterning state, as shown in the figure. As a result, even when hydrogen is generated on the memory cell array in the passivation process, the wiring layer 80 absorbs or intercepts hydrogen, and hydrogen can be prevented from reaching the ferroelectric layer 14. Also, after the wiring layer 80 is patterned, its surface alone may be oxidized, whereby the surface of the wiring layer can be provided with a hydrogen barrier performance. In particular, when the surface of the wiring layer 80 remaining on the memory cell array is oxidized, and the hydrogen barrier performance appears, this structure provides an extremely effective protective measure against hydrogen generated in the passivation process. As the oxidation method, short-time heat-treatment in an oxygen atmosphere, exposure to oxygen plasma, or the like can be enumerated. For example, when aluminum is used as the wiring layer, aluminum oxide is formed on the surface. The aluminum oxide functions as an excellent hydrogen barrier, as described above.

EXPERIMENT EXAMPLE

Figure 19:
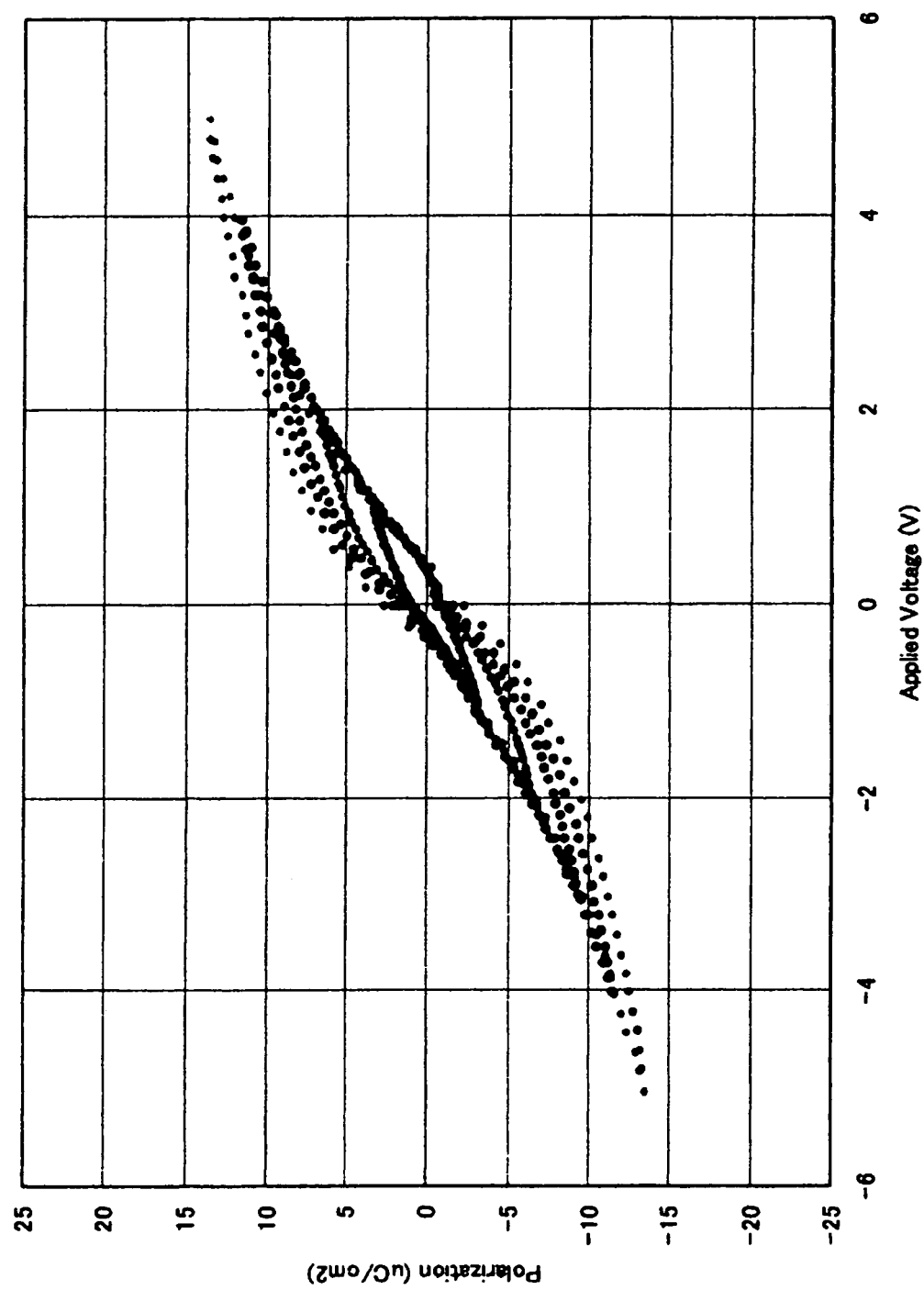
FIG. 19 is a diagram showing hysteresis loops in accordance with a comparison example.
Figure 20:
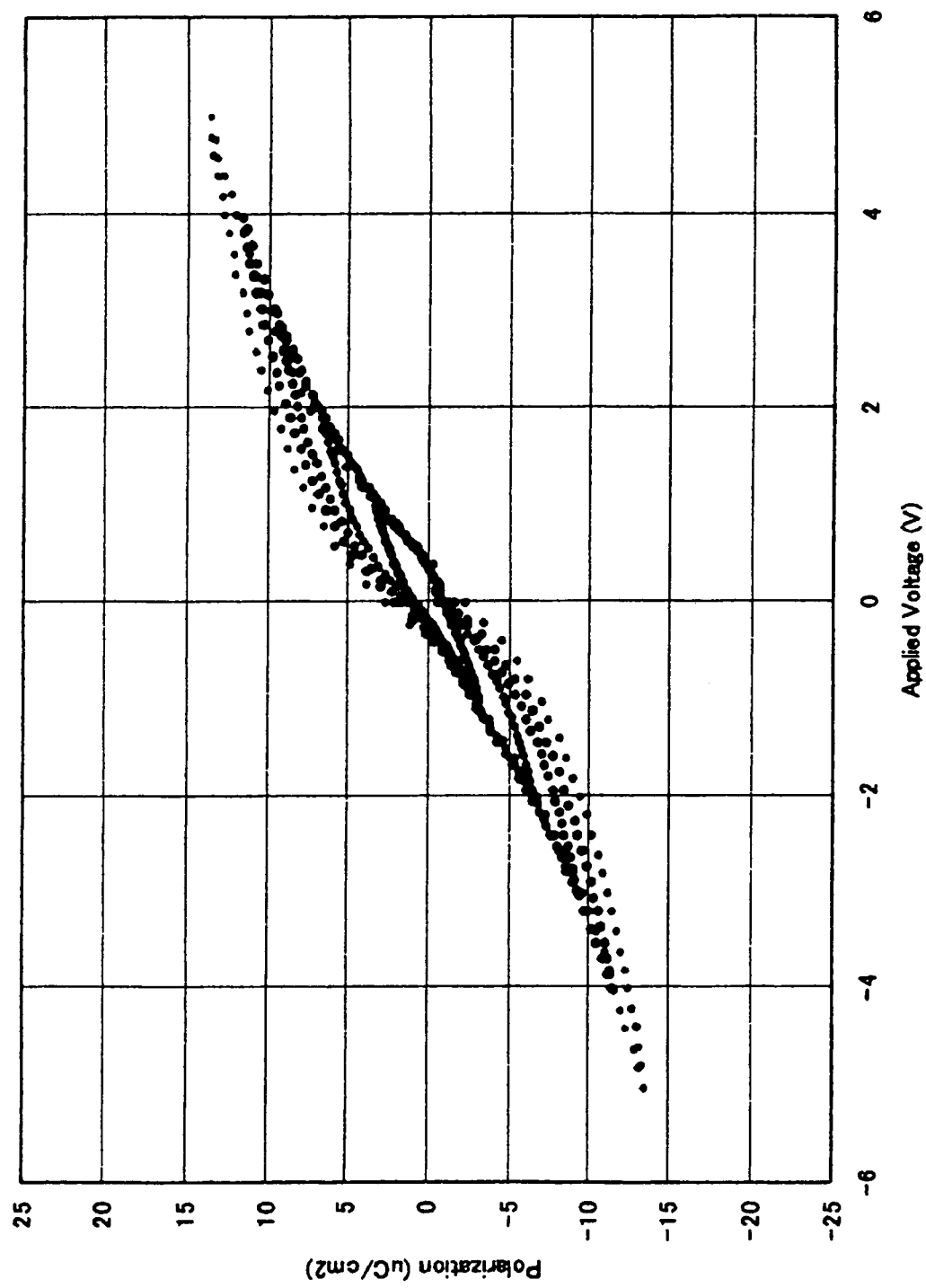
FIG. 20 is a diagram showing hysteresis loops in accordance with a comparison example.
Figure 21:
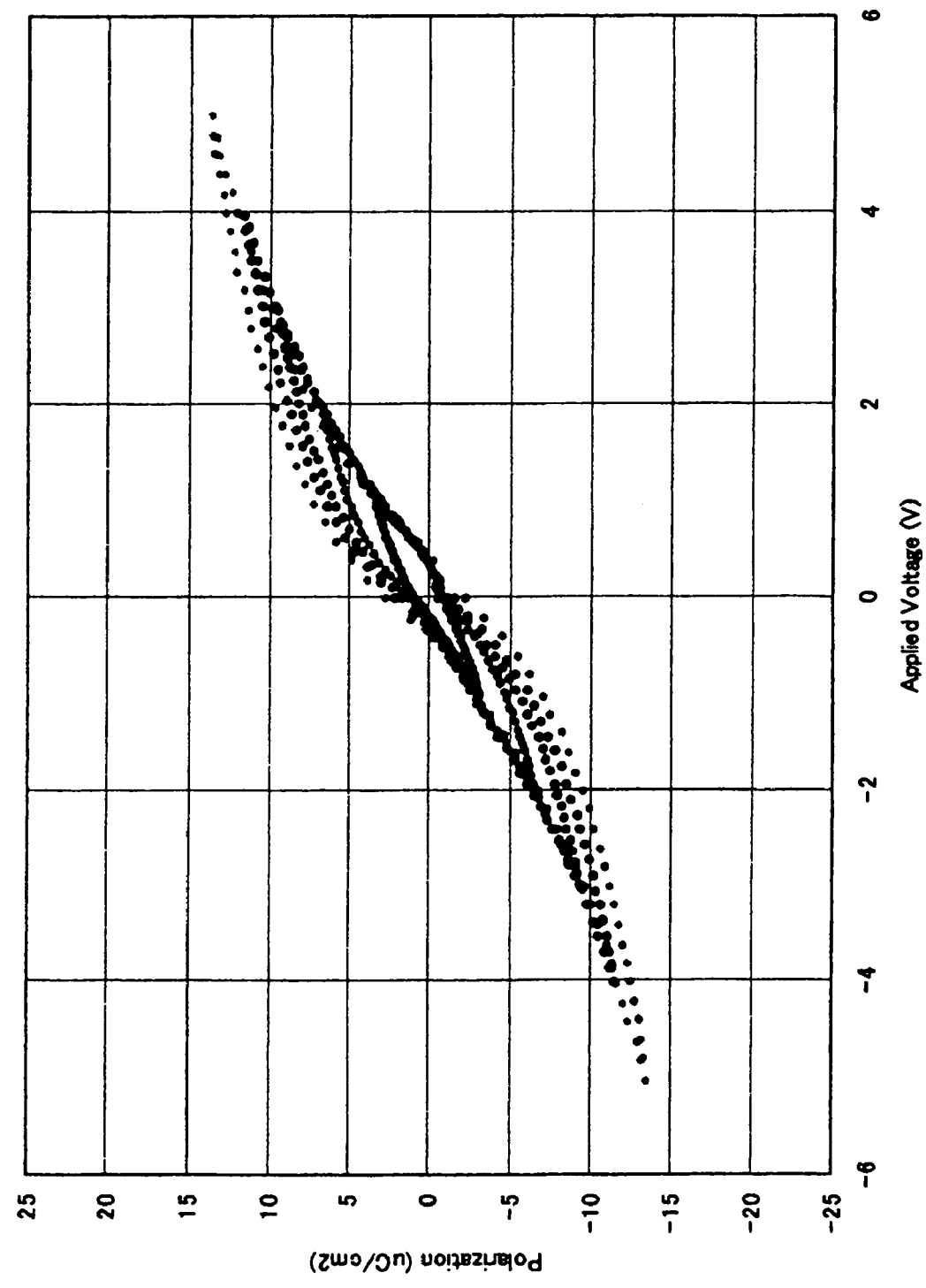
FIG. 21 is a diagram showing hysteresis loops in accordance with a comparison example.
Figure 22:
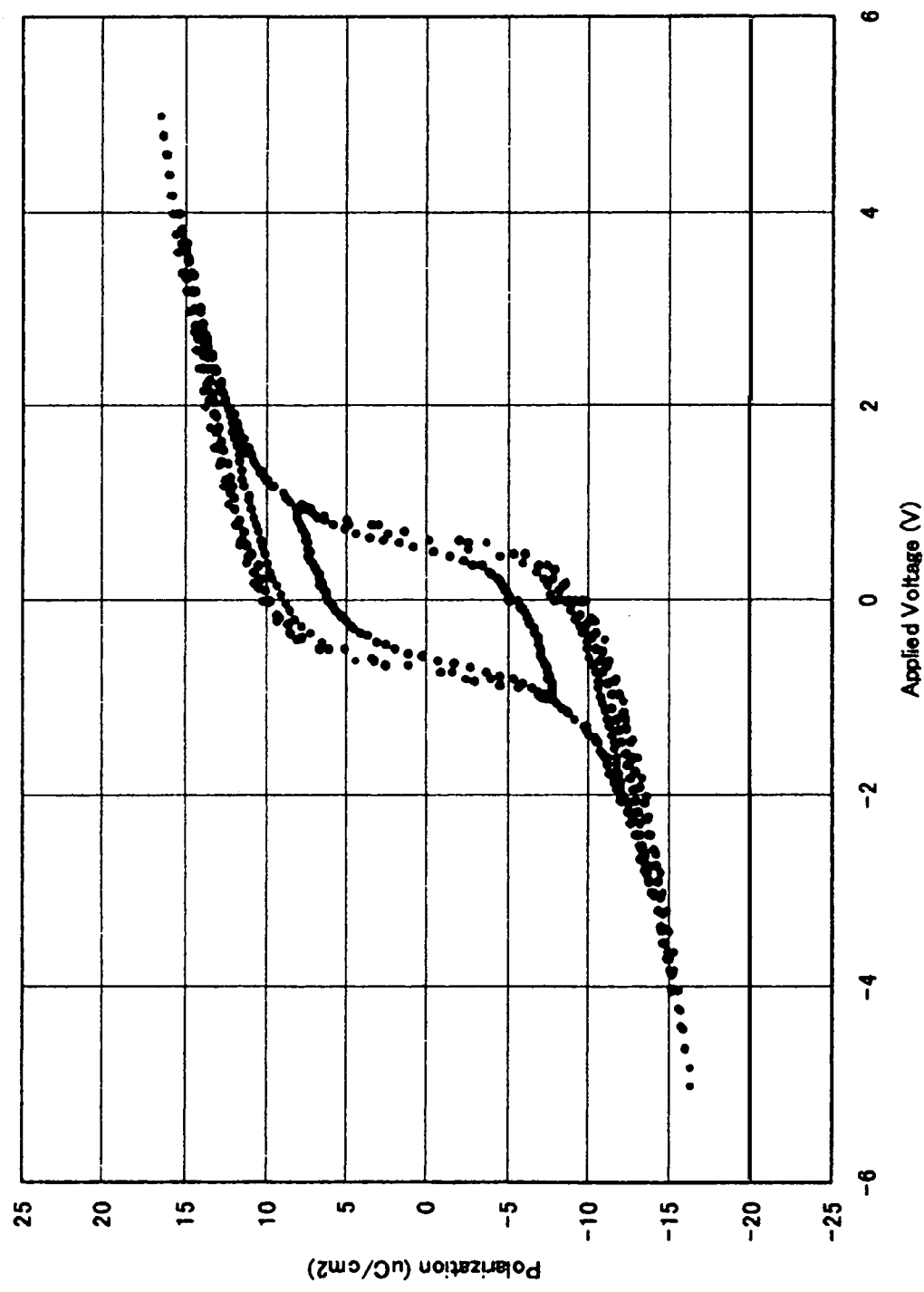
FIG. 22 is a diagram showing hysteresis loops in accordance with the present embodiment example.

To confirm the effectiveness of the device structure in accordance with the present embodiment, samples of four levels were made as comparison examples. A sample that omits the bottom hydrogen barrier film 46 is Sample 1, a sample that omits the first hydrogen barrier film 40 is Sample 2, a sample that omits the second hydrogen barrier film 42 and the third hydrogen barrier film 44 is Sample 3. Each of the samples has the same memory cell array structure shown in FIGS. 2 through 5, except that a part of the hydrogen barrier films is omitted. Ferroelectric characteristics of each of the samples were examined after the second protection layer 38 was formed. The results obtained from Sample 1 through Sample 3 are shown in FIGS. 19 through 21, respectively. Also, ferroelectric characteristics of the device structure of the present invention shown in FIGS. 2 through 5, which were measured after the protection film 38 was formed, are shown in FIG. 22.

It is obvious from FIGS. 19 through 22 that the ferroelectric characteristics of Sample 1 through Sample 3 considerably deteriorate. On the other hand, the device structure of the present invention secured the characteristics equal to those at the initial stage. More specifically, in the structure of the present invention, it became clear that if the disposition of the hydrogen barrier films was not sufficient, the process tolerance thereafter could not be secured. To protect the ferroelectric layer 14 from process-originating damages caused by reduction, it became clear that the disposition of the hydrogen barrier films in portions around the memory cell array shown in the embodiment example in FIGS. 2 through 5 was extremely important.

What is claimed is:

1. A ferroelectric memory element comprising:
a memory cell array having memory cells arranged in a matrix configuration, each of the memory cells having:
   a lower electrode;
   an upper electrode arranged in a direction intersecting the lower electrode; and
   a ferroelectric layer disposed at least in an intersecting area between the upper electrode and the lower electrode, wherein a first hydrogen barrier film directly contacts the lower electrode and a second hydrogen barrier film separate and apart from the first hydrogen barrier film directly contacts the upper electrode; and
wherein the second hydrogen barrier film is formed at side walls of the lower electrode, the upper electrode, and the ferroelectric layer.

2. The ferroelectric memory element according to claim 1, comprising a peripheral circuit section for selectively writing or reading information in and from the memory cells, wherein the first and second hydrogen barrier films are not formed over the peripheral circuit section.

3. The ferroelectric memory element according to claim 1, further comprising an interlayer insulation layer provided over the memory cell array, wherein the second hydrogen barrier film is provided between the interlayer insulation layer and the memory cell array.

4. The ferroelectric memory element according to claim 3, further comprising a third hydrogen barrier film provided over the interlayer insulation layer.

5. The ferroelectric memory element according to claim 1, wherein the upper electrode or the lower electrode contains a material having a hydrogen barrier function.

6. The ferroelectric memory element according to claim 1, wherein the ferroelectric layer is provided only in the intersecting area between the lower electrode and the upper electrode.

7. The ferroelectric memory element according to claim 1, wherein each of the hydrogen barrier films are an oxide including at least one element selected from aluminum, titanium, hafnium, zirconium, magnesium and tantalum.

8. The ferroelectric memory element according to claim 1, wherein the second hydrogen barrier film is an oxide including at least one of elements in the ferroelectric layer.

9. The ferroelectric memory element according to claim 1, further comprising a wiring layer that connects the memory cell array and the peripheral circuit section, wherein a material to be used as the wiring layer is deposited over the memory cell array insulated from the wiring layer.

10. The ferroelectric memory element according to claim 8, wherein the material to be used as the wiring layer has a surface that is oxidized.

* * * * *